US007057491B2

(12) United States Patent
Dempsey (10) Patent No.: US 7,057,491 B2
(45) Date of Patent: Jun. 6, 2006

(54) IMPEDANCE NETWORK WITH MINIMUM CONTACT IMPEDANCE

(75) Inventor: Dennis A. Dempsey, Co. Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/252,314

(22) Filed: Sep. 23, 2002

(65) Prior Publication Data

US 2004/0056756 A1    Mar. 25, 2004

(51) Int. Cl.
*H01C 1/12*    (2006.01)
(52) U.S. Cl. ............... 338/320; 338/308; 338/326; 338/295
(58) Field of Classification Search ............ 338/307, 338/195, 320, 295, 309, 326; 307/98; 257/537, 257/538
See application file for complete search history.

(56) References Cited

U.S. PATENT DOCUMENTS

| 3,928,837 | A | * | 12/1975 | Esper et al. ............ 338/32 R |
| 3,995,249 | A | * | 11/1976 | Ferry ..................... 338/292 |
| 4,196,411 | A | * | 4/1980 | Kaufman ................ 338/314 |
| 4,215,333 | A | * | 7/1980 | Huang .................... 338/322 |
| 4,286,249 | A | * | 8/1981 | Lewis et al. ............ 338/275 |
| 4,298,856 | A | * | 11/1981 | Schuchardt ............. 338/195 |
| 4,505,032 | A | * | 3/1985 | Praria .................... 338/295 |
| 4,682,143 | A | * | 7/1987 | Chu et al. .............. 338/307 |
| 4,862,136 | A | * | 8/1989 | Birkner ................. 338/195 |
| 4,999,731 | A | * | 3/1991 | Bender et al. .......... 361/119 |
| 5,015,989 | A |   | 5/1991 | Wohlfarth et al. |
| 5,268,651 | A |   | 12/1993 | Kerth |
| 5,309,136 | A | * | 5/1994 | Rezgui et al. ............ 338/2 |
| 5,601,367 | A | * | 2/1997 | Nara ..................... 374/183 |
| 5,640,137 | A | * | 6/1997 | Mantha ................. 338/308 |
| 5,872,504 | A | * | 2/1999 | Greitschus et al. ..... 338/320 |
| 5,929,746 | A | * | 7/1999 | Edwards et al. ........ 338/320 |
| 6,084,502 | A |   | 7/2000 | Ariga et al. |
| 6,452,519 | B1 |   | 9/2002 | Swanson |
| 6,489,881 | B1 | * | 12/2002 | Aleksandravicius et al. ..... 338/307 |

FOREIGN PATENT DOCUMENTS

| EP | 0955678 | 11/1999 |
| JP | 6084621 | 3/1994 |
| JP | 10032110 | 2/1998 |

* cited by examiner

*Primary Examiner*—Tu Hoang
(74) *Attorney, Agent, or Firm*—Wolf, Greenfield & Sacks, P.C.

(57) ABSTRACT

An impedance network configuration in the form of a snake-like or ladder structure is provided. The ladder configuration enables the provision of tabs extending outwardly from the normal conducting path, the tabs providing a location for the provision of contact layers. Using such a configuration the contribution of the contact impedance can be minimized and also programming of the configuration may be effected.

12 Claims, 11 Drawing Sheets

IMPEDANCE NETWORK WITH MINIMUM CONTACT IMPEDANCE

FIELD OF THE INVENTION

The invention relates to an impedance network and, in particular, to an impedance network formed from one or more resistor structures or elements and, further, to a network that is adapted to minimize the contribution of contact impedance to the overall impedance of the network.

BACKGROUND TO THE INVENTION

Figure 1A:
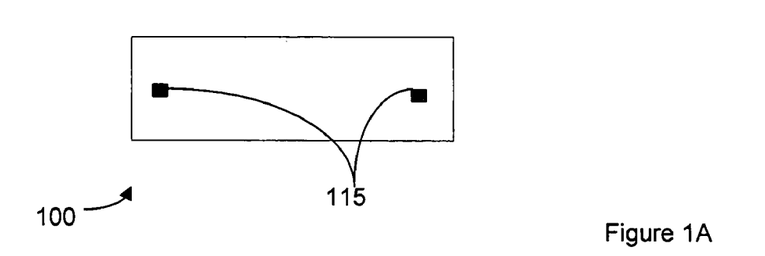
FIGS. 1A–1D are examples of prior art configurations of resistor structures.
Figure 1B:
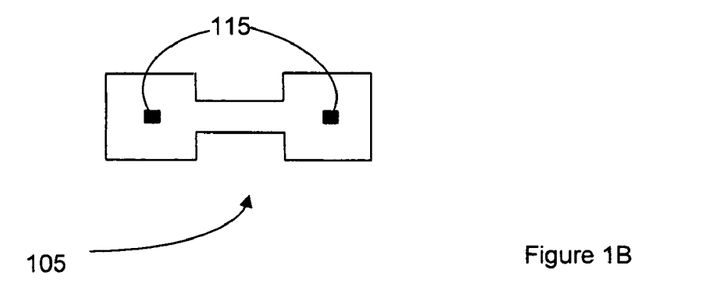
Figure 1C:
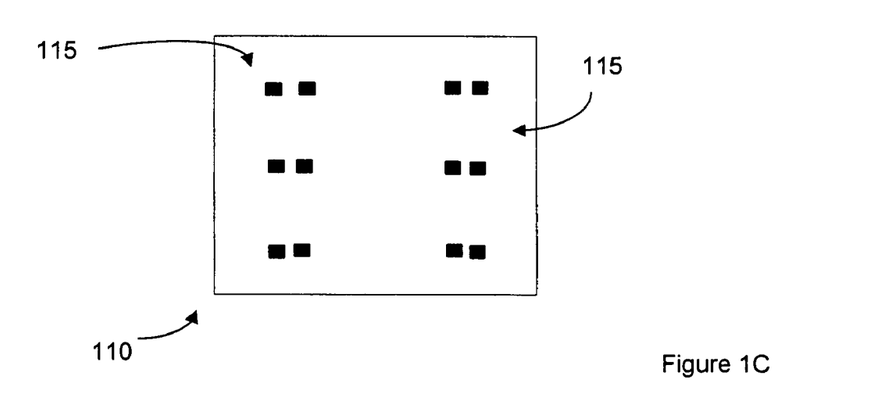
Figure 1D:
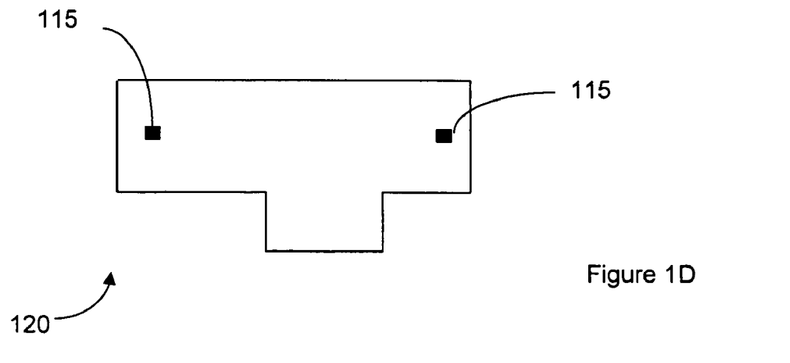

Impedance networks are well known in the art and typically include one or more resistor structures which are combined so as to provide gain configurations to divide a voltage level into substantially proportionally matched levels. They are commonly used in amplifier configurations, digital-to-analog converters, analog-to-digital converters and indeed in widespread analog and RF circuitry applications. When implemented in an integrated circuit (IC) environment, the resistor is formed by the creation of a resistive element in a layer of the IC. The physical configuration of the resistive layer may vary depending on the application. Examples of such known configurations are shown in FIGS. 1A to 1D which show respectively a standard resistor 100, a dog-bone resistor 105, a wide resistor configuration 110 and a tabbed resistor 120. Although the physical layout of these configurations may vary, they all utilize end point contact layers 115 so as to provide an equivalent two terminal impedance. As shown in FIG. 1C, the end point contact layers 115 may be provided in one or more rows; in the embodiment of FIG. 1C, two rows of three contact layers are provided. The contact impedance provided by the physical contact of the end point contact layers to the base IC structure has a contributing effect towards the overall resistance of the structures, which is undesirable as it is not an accurately definable value and may drift during operation. The series contact structure has a non-zero impedance. The finite series impedance effect of the contact structure can be undesirable as it is different from the base layer of the resistor, and the contact structure often has less well controlled and lower performance resistive properties.

Examples of the use of resistor string configurations are described in U.S. Pat. No. 6,452,519, which provides for a placing of contacts to the resistor string outside of the current path of the resistor string so as to provide a resistor string having a very low temperature drift.

It is also known to provide what are commonly called "snake" or "ladder" configurations. Examples of these configurations are described in U.S. Pat. No. 5,268,651 and EP 0 955 678. In the configuration of U.S. Pat. No. 5,268,651 an integrated circuit resistor structure is described which has a forced high end and a forced low end and is designed for specific application for use in instrumentation amplifiers. It includes an operational amplifier which regulates the current between the force high connection and the force low connection in response to the voltage sensed in internal sensing connections of the resistor structure. This requirement for sensing elements requires an asymmetric resistor structure design and is specifically suited for high impedance sensing applications.

EP 0 995 678 describes the uses of a ladder type structure for application in digital to analog converters (DACs). The resistor structure provides a conducting path with a path meander configuration so as to provide a voltage divider network. At each location where a voltage level is to be established the conducting path has an expanded region, called a junction region. The centres of all the junction regions are equidistant from the centres of neighbouring junction regions, and have a metal patch extending therefrom. The metal patches are coupled to conducting plugs, or contacts, that can be coupled to switching elements of a DAC. Although the physical centers of the junction regions may be equidistant, the current path in the junction regions is not Manhattan, or perpendicular, in nature. This is somewhat shown by the voltage profile of FIG. 2 of the specification. This simulation output superimposed upon the structure does not appear to show the true real-life effect of the metal patch, or contact, in the centre of this region. Such contact structures in the current path are disadvantageous.

There is therefore a need to provide a snake-like network impedance structure that reduces the contact impedance contribution of the individual elements and the overall resistance of the structure.

Accordingly, there is a need for a resistor network configuration that is adapted to minimize the contribution of the contact impedances to the overall resistance of the structure.

SUMMARY OF THE INVENTION

These needs and others are satisfied by the present invention which provides a resistor string configuration with reduced contact layer or structure contribution to the overall impedance of the configuration.

According to a first embodiment, the present invention provides a snake-like resistor network configuration having a continuous resistive element formed in a first layer of an integrated circuit, the resistive element having a first end and a second end, the region between the first and second ends defining a normal conducting path along the structure through which charge will normally travel (i.e., a current will exist), the configuration being provided by a plurality of parallel rows, each row having a start portion and an end portion, the end portion of a first row being linkable to the start portion of a second row by means of a linking portion of same resistive material as that of the rows, and wherein the configuration further provides a plurality of nodes between the first and second ends, each node being formed in a tab provided adjacent to the linking portion, the tab extending outwardly and substantially perpendicularly from the normal conducting path.

The tab is desirably provided substantially midway along the linking portion.

The linking portion is desirably configured as to be orientated on the integrated circuit in a position substantially perpendicular to the orientation of the parallel rows. The orientation of the tabs is therefore such as to be substantially parallel to the rows.

The first and second ends are desirably provided with at least one contact layer, the contact layer providing for the application of an applied signal to the network.

The invention additionally provides a voltage dividing circuit for use in an integrated circuit comprising a path of conducting material having at least two parallel rows linked to one another by a linking portion which is substantially perpendicular to the parallel rows, the linking portion being further provided with a tab extending outwardly from the linking portion and substantially perpendicular thereto, the tab being arranged for providing voltage levels for the voltage dividing circuit.

Desirably, the circuit includes a pair of parallel rows, each pair provided with a linking portion and tab extending therefrom, the combination of the two pairs providing a symmetrical resistor.

The invention may also be used to provide DAC configurations of varying types.

These and other features, objects and advantages of the present invention will be better understood with reference to the following drawings and description.

DETAILED DESCRIPTION OF THE DRAWINGS

FIGS. 1A–1D have been described with reference to the prior art.

Figure 2A:
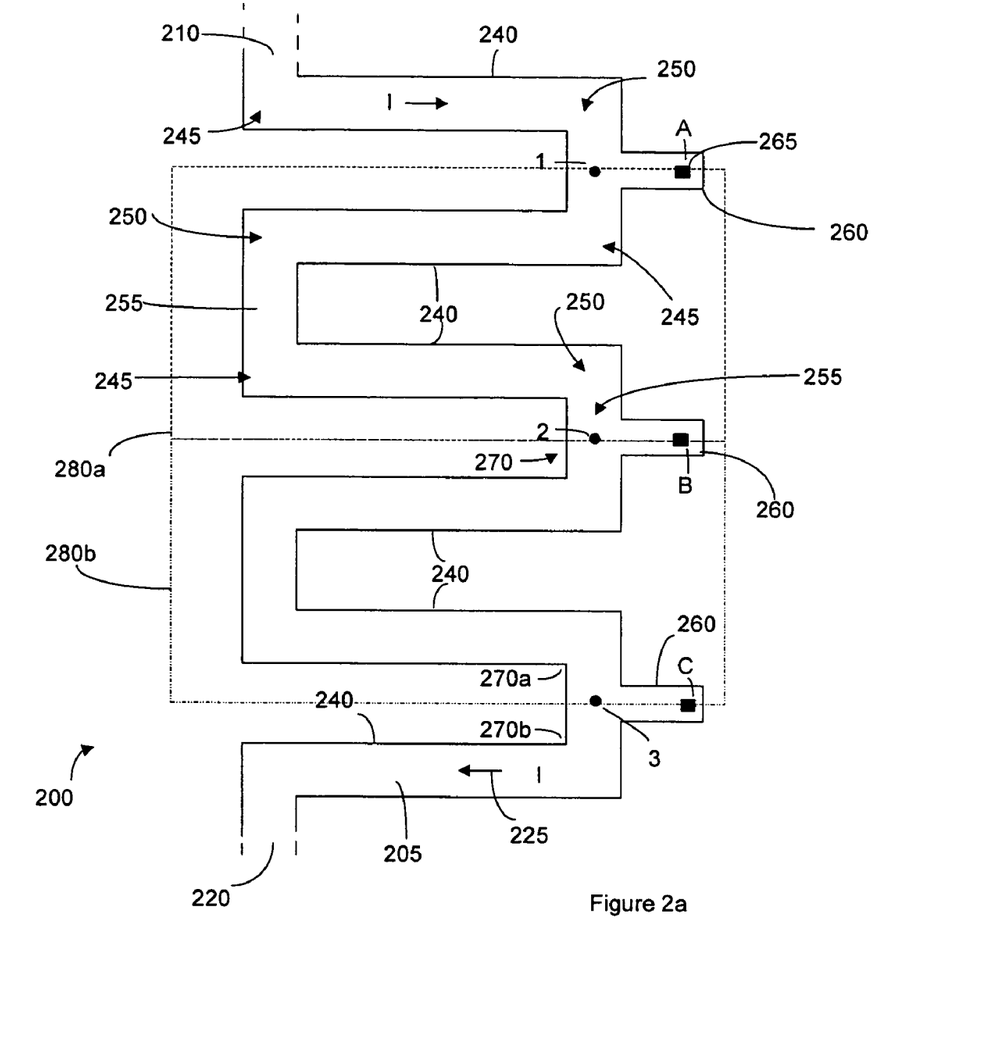
FIG. 2a shows is a plan view in schematic form of a network impedance configuration according to the present invention.

FIG. 2a shows a portion of a snake-like resistor string 200 illustrating an embodiment according to the present invention. The string or network uses minimum contacts along the current path, thereby minimizing the contribution of contact impedance in the network. The termination of the network requires contact elements but the requirement for contacts is otherwise obviated. It is advantageous in that it enables implementation in reduced area, and thus at lower cost, and is suitable for enhanced manufacturability and matching performance. It will be appreciated that separate unit resistors, as per FIGS. 1A–D, require both series contact impedance in the path and also extra interconnectivity, which introduces yet more sources of variance. The contact structure itself can have a significant area increase impact. Furthermore, wafer fabrication layout rules dictate a separation between the end terminals of such series coupled unit impedance. This separation takes more area, which increases the cost and can also reduce the manufacturability through gradient effects being more significant over longer distances. The interconnectivity is undesirable as it is conventionally among the lower performance and lesser controlled elements of wafer fabrication processes.

The network is formed from a continuous resistive element 205 formed from a plurality of individual elements joined or coupled together, the element 205 being provided in a first layer of an integrated circuit. The resistive element 205 has a first end 210 and a second end 220, with the region between the first and second ends defining a normal conducting path 225 along the structure through which charge will normally travel.

The configuration is provided by a plurality of parallel rows 240, each row having a start portion 245 and an end portion 250. The end portion of a first row is linked to the start portion of a second row by means of a linking portion 255 which is of a same resistive material as that of the rows. It will be appreciated that adjacent parallel rows will have complementary start and end portions. For example as seen in FIG. 2a, the start portion 245 of the first parallel row is on the left hand side, whereas that of the second row is on the right hand side. Each linking portion 255 is desirably configured to be substantially perpendicular to the two rows which it links. One or more of the individual linking portions 255 may be provided with a tab 260 which extends outwardly and substantially perpendicularly from the normal conducting path 225. Each tab 260 is desirably provided with a node or contact element layer 265 (A, B, C) which is preferably positioned within the tab at a position which is remote from the normal conducting path 225. The tab 260 is preferably provided at a position along the linking portion which is substantially half or midway between two adjacent rows. By providing the tab substantially perpendicularly to the linking portion with which it is intimate, the configuration of the present invention provides for the tab, with its associated node to be substantially parallel with the rows 240 with which the snake-like structure is formed.

It will be appreciated from an examination of FIG. 2 that the nodes 265 (A, B, C) are co-linear with corresponding "nodes" 1, 2, and 3 provided within the normal current path. These nodes 1, 2 and 3, are not physical contacts, but merely graphically represent locations in the normal conducting path where an equivalent terminal of the conduction path for a unit impedance element in the network may be considered as being located. It will be appreciated that the locations illustrated are substantially equivalent to the location where an end termination of an equivalent impedance element may be located, the exact positioning of these nodes 1, 2, 3 is a complex matter and depends inter alia on the nature of the current flow. Nodes 1, 2, 3 differ from the physical nodes 265 (A, B, C) in that they are not provided with a contact, and therefore do not have an impedance contribution to the overall impedance value of the network. If no significant current flows from the numerical nodes 1, 2, 3, to the alphabetical nodes, i.e. those provided in the tab portions, then the contact impedance of the contact layers A, B, C has a negligible contribution to the overall current flow, I.

Figure 3:
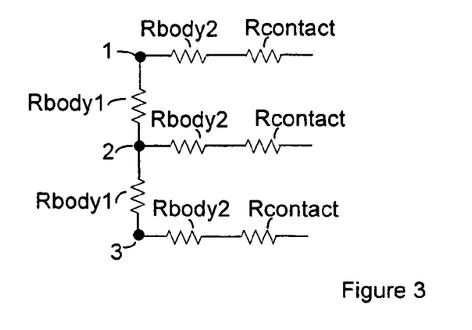
FIG. 3 shows an equivalent circuit to the configuration shown in FIG. 2a, FIGS. 4a to 4F are finite element analysis of the current flow in a series of configurations according to the present invention.

It will be appreciated that the numerical "nodes" substantially define terminals of the equivalent "unit" resistor (impedance) within this resistive network, which will be further appreciated from an examination of the equivalent resistor configuration for a "unit" resistor of the plan schematic of FIG. 2, which is shown in FIG. 3. It will be understood that FIG. 3 provides the schematic for the two unit resistors 280a, 280b which are shown in FIG. 2a, which as they are symmetrical have the same body resistance values Body 2 (as provided by the resistance of the tab material) and Body 1 (as provided by the resistance of the normal conducting path between the numerical nodes 1 and 2 and the numerical nodes 2 and 3).

Figure 2B:
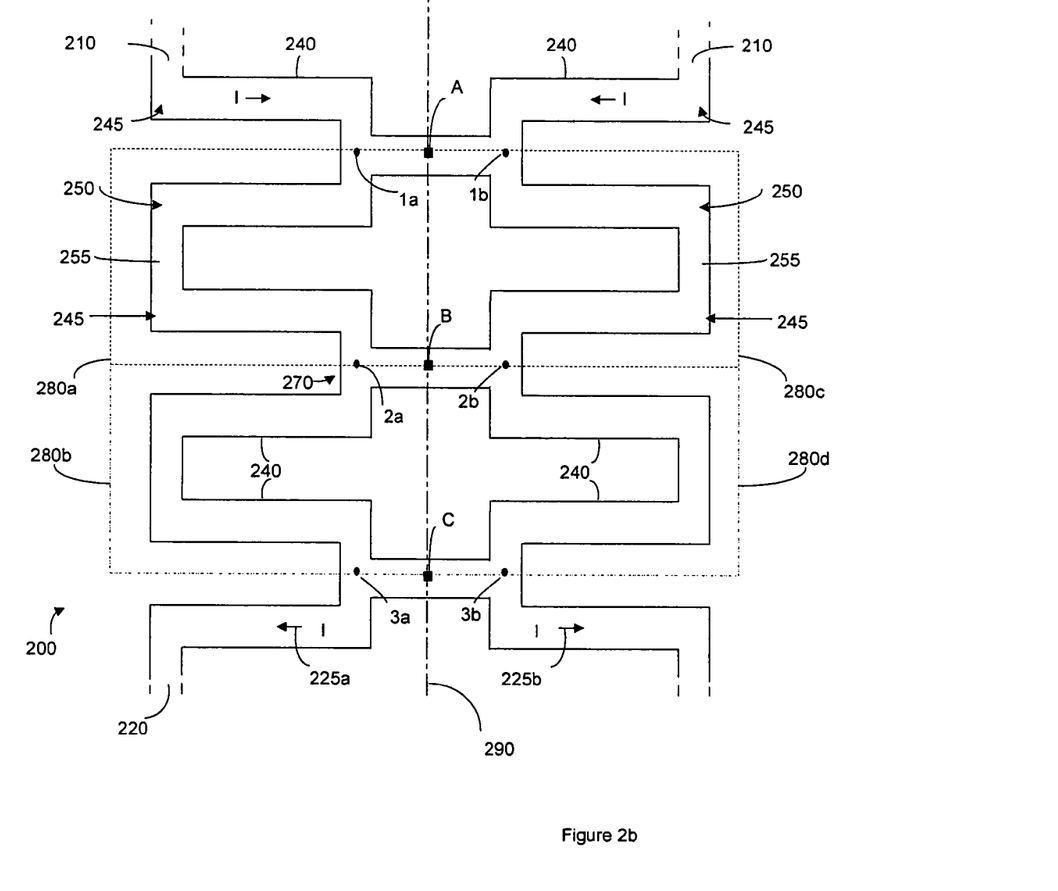
FIG. 2B shows in plan view an alternative configuration according to the present invention.

FIG. 2b shows an alternative configuration to that of FIG. 2a. In this embodiment, the two-unit resistor configuration of FIG. 2a is replicated along a mirror axis 290 so as to provide two additional unit resistors 280c, 280d (i.e., a configuration of two cross-connected two-unit resistor configurations). The dashed lines used to define the extent of the unit resistors 280a, 280b, 280c or 280d are, it will be appreciated, an arbitrary delineation of the configuration into specific elements. It will be understood that it is not intended to limit the definition of any one element to the extent defined by these drawings, as other definitions of a unit resistor will be apparent to those skilled in the art. It will be appreciated that the utilization of either of these additional resistors is dependent on the signal applied to the nodes A, B, C which in essence enables a programming of the network configuration. In a normal operation, no signal is applied to the control nodes and the normal conducting path is through the resistors elements 280a, 280b, but on application of a control or programming signal to the contact layers A, B, C, the normal conducting path can be altered to route through either or both of the additional elements 280c, 280d.

Figure 2C:
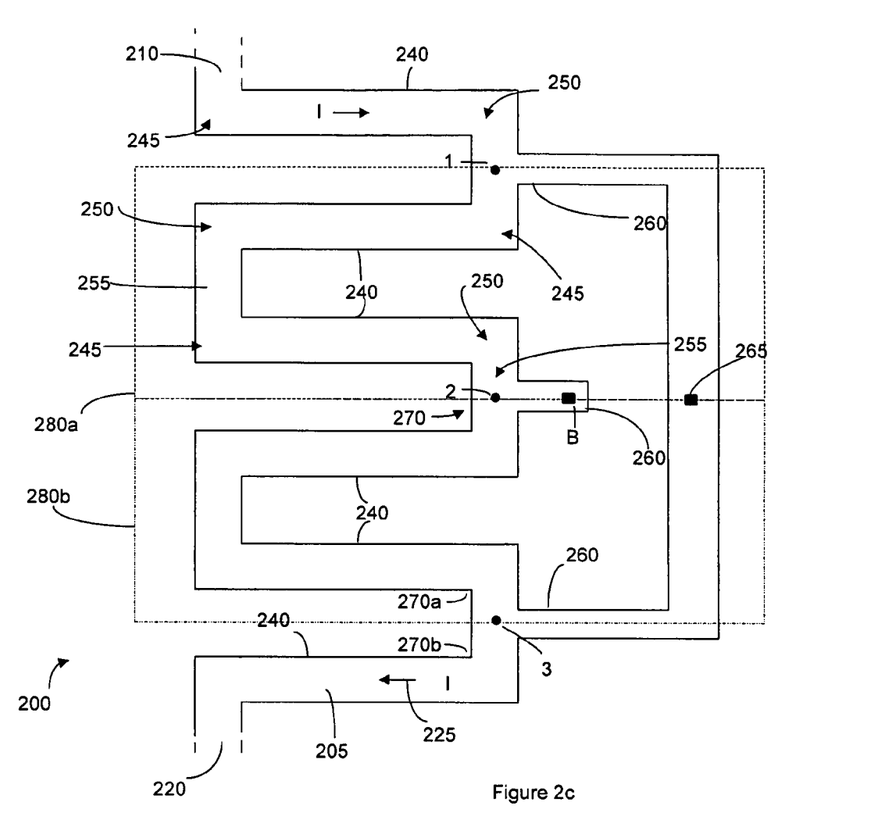
FIG. 2C shows yet a further alternative embodiment.

FIG. 2c shows yet a further embodiment wherein the tab portion 260 in which node A of FIGS. 2a and 2b was provided is extended outwardly to join directly onto the tab portion where node C was previously. In this exemplary embodiment, a single contact layer 265 is provided in this extended tab portion 260 in a position substantially coincident with that of node B in the third tab portion. By application of suitable programming signals, the normal conducting path can be altered to route through this extended tab portion, as desired.

Figure 4A:
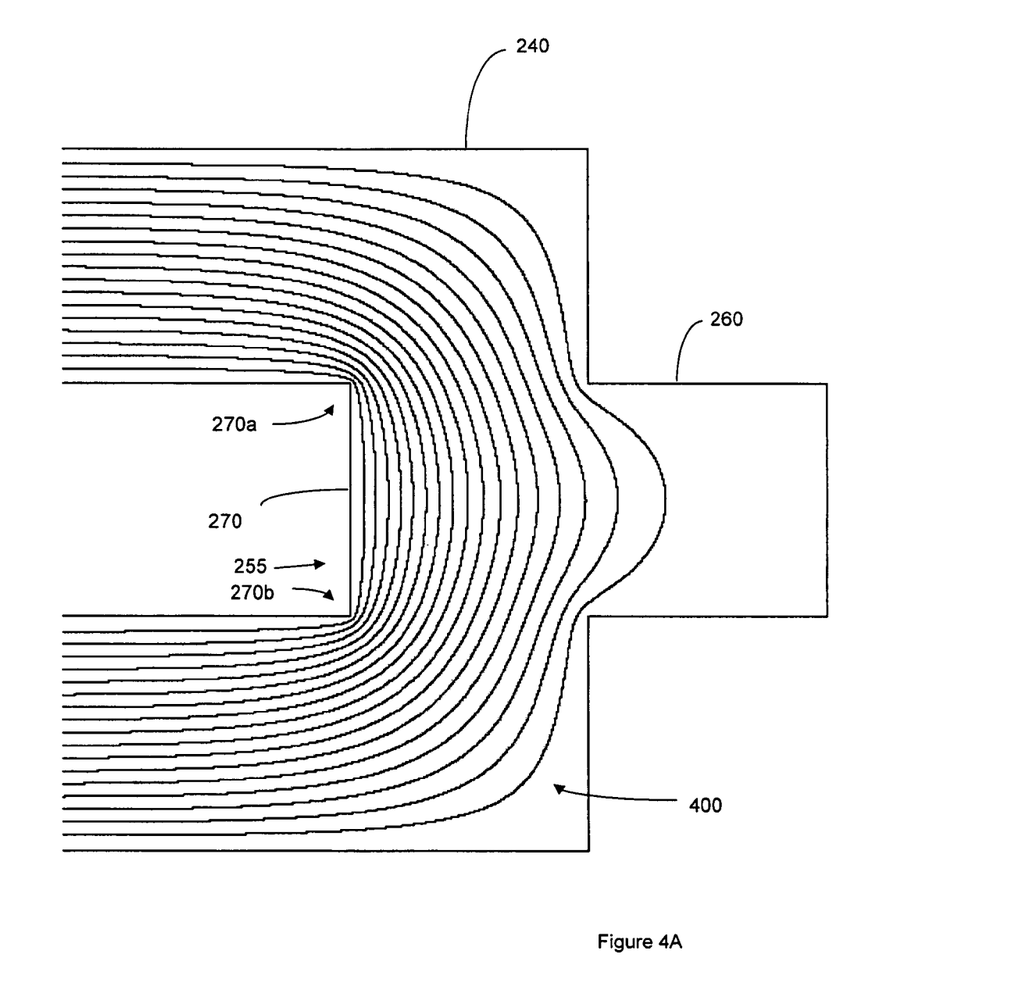
Figure 4B:
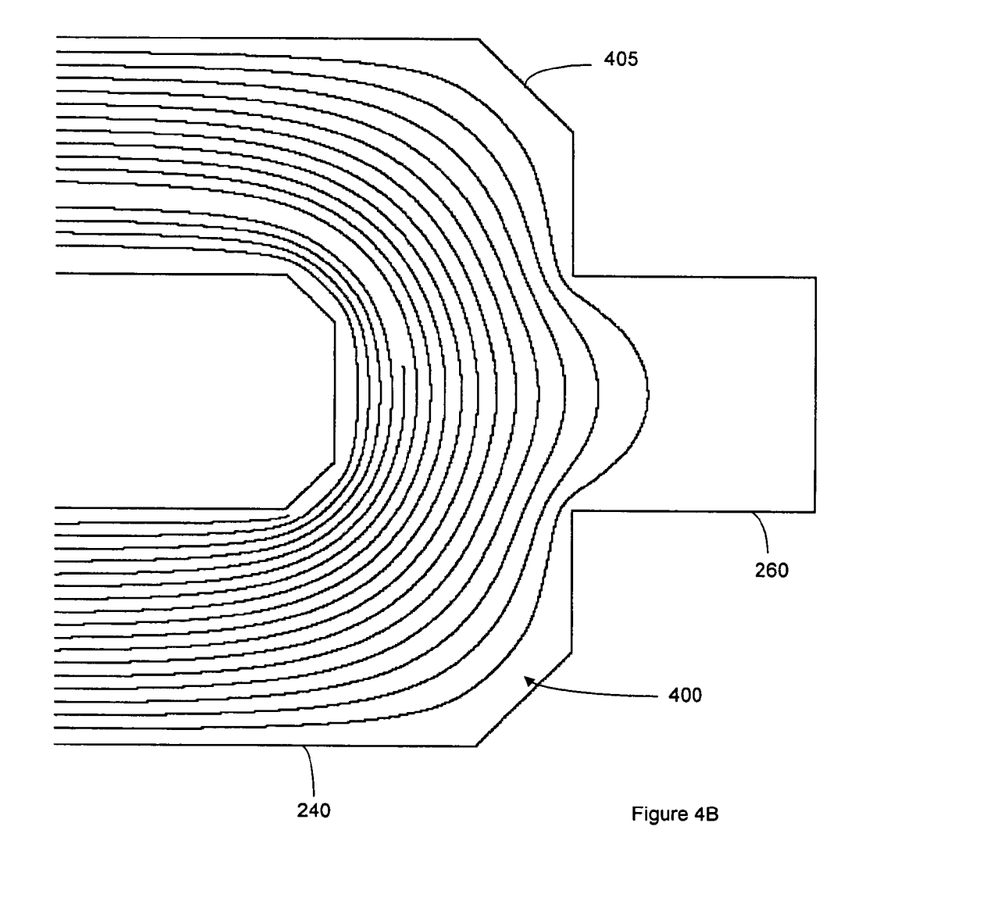
Figure 4C:
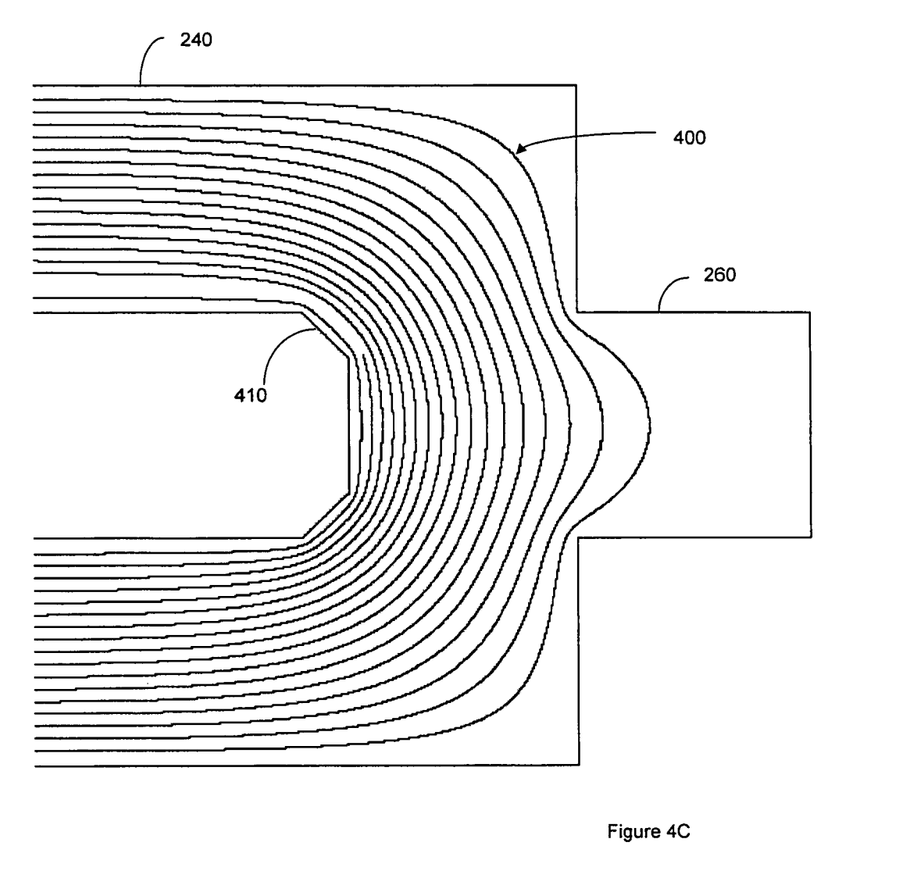
Figure 4D:
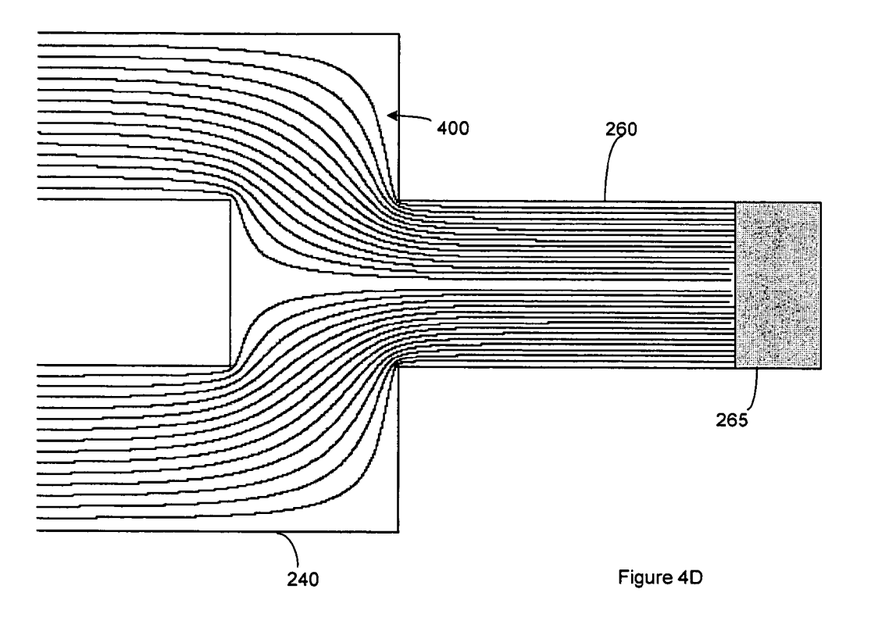
Figure 4E:
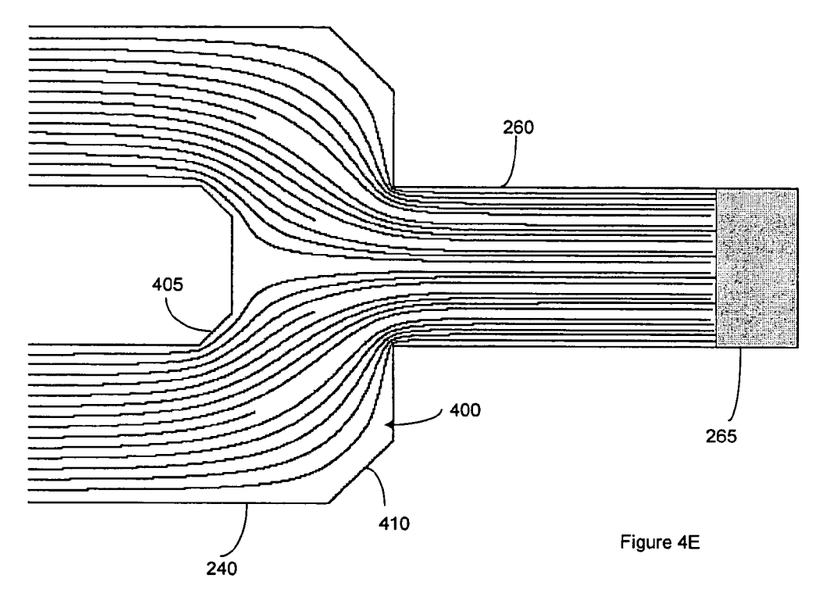
Figure 4F:
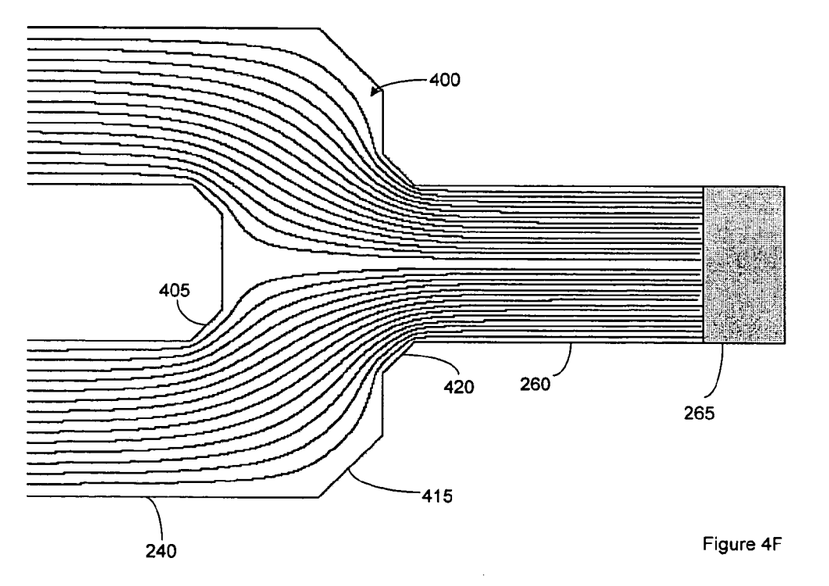

From an examination of the finite element analysis of the current flow through the linking portion, as shown in FIG. 4A, it can be appreciated that the current density is greatest at the side 270 of the linking portion 255 remote from the tab portion 260. The current tends towards the corners 270a, 270b of the side and there is little current flow in the tab. Using an analogy of the current behaving like traffic on a route, it will be appreciated that the current center tends towards the inside of the bend on the normal current path. It will be appreciated that due to the finite accuracy of IC fabrication techniques used to provide such structures in silicon, that a rounding of the corners 270a, 270b may result. Such an embodiment is shown in FIGS. 4B, 4C, 4E, and 4F which are also exemplary of the type of normal current flow 400 that may result from varying configurations. In the latter Figures, a diagonal portion 410 is provided at the corners 270a, 270b, which provides for a more arcuate path for the current than is possible using abrupt edge structures. FIGS. 4B, 4E and 4F also show examples of modifications that can be provided on the outer corners at the joining of the linking portion and the parallel rows, wherein a single 405 or double 405, 420 diagonal may be provided to alter the current path somewhat. It will therefore be understood that although the accompanying drawings illustrate corners formed from differing configurations, that it is not intended to limit the present invention to such exemplary embodiments, as some further or alternative rounding or curvature may be introduced to the actual fabricated devices.

In a configuration where the nodes A, B, C are connected to a substantially high impedance relative to the resistive network impedance, the nodes 265 do not provide for significant current flow between their corresponding numerical "nodes" and therefore there is no significant contribution from the contact impedance to the main current. An example of such configurations is where the node is coupled to the gate of a MOS transistor with negligible gate current and where the nodes is coupled to a switched impedance and said switch is in the "off" state. As shown in the schematic of current density for a specific portion of the configurations of FIGS. 4A to 4C, the current density along the linking portion is highest at the region furthest from the node 265, and very little current flows in the tab portion.

In a lower impedance configuration (e.g. in a digital-to-analog converter with the coupling switch in the "on" state), where for example the nodes 265 provide some sort of programmable contribution, there will be a current flow in the tab 260. Such examples are shown in FIGS. 4D to 4F. It will be appreciated that as the tab extends substantially perpendicularly from the normal current path, that the current flow can be accurately determined and its contribution assessed, in a manner apparent to those skilled in the art.

It will be appreciated from the replicated structure of FIG. 2 that the main current path in this structure remains substantially "contactless" for the full length of the snake-like configuration until it is required to change from the base resistor layer to another layer, for example a metal interconnect layer. The total voltage $V_{total}$ for the configuration can therefore be defined, using a standard equation for N resistors with two contacts, as:

$$V_{total} = I \left( \sum_{1}^{N} R_{DAC} + 2 \sum_{1}^{N} R_{contact} \right)$$

which reduces using the network configuration of the present invention to:

$$V_{total} = I(NR_{DAC} + 2R_{contact})$$

This equation, it will be appreciated, may be used to evaluate the total voltage for configurations according to the present invention.

As $N \to \infty$, $$\frac{f(R_{contact})}{f(R_{DAC})} \to 0$$

(i.e. the contact impedance effects tend to zero), which will be appreciated as being highly desirable.

This will be appreciated as being equivalent to the sum total of the resistance of the entire configuration being attributable to the contribution from the body impedance.

Although shown as physical contacts, it will be appreciated that the "key" nodes 1, 2 and 3, as shown in FIGS. 2a–2c, do not have contacts. The termination nodes, on the other hand, are required for physical connection of the snake-like configuration to other interconnect layers, and are provided in the form of physical contacts. The formation of contacts in such an impedance network may be implemented in a variety of different manners as will be appreciated by those skilled in the art of IC fabrication technology. Although shown in the accompanying figures as simple structures, it will be appreciated that the formation of such contact structures is a complex issue. Further information pertaining to such contact structures and their formation may be found in various sources, such as the text book: "Physics of Semiconductor Devices" by S. M. Sze. It will be appreciated that the terms "layers" or "structures" are used interchangeably within the present specification and it is intended to describe the same contact elements using these two phrases.

It will be appreciated that the resistive element or structure of the present invention is formed in a base layer of an IC, typically a polysilicon layer or some other suitable material. The formation of such configurations will be well known to those skilled in the art who will also appreciate that the layer can be chosen from the available layers based on electrical parameters, e.g. voltage and temperature coefficients, implementation cost, manufacturability performance and suitability in the application e.g. leakage current can be a major concern in diffused/ion implanted resistors under high temperature operation. Some applications may require the use of materials such as those provided by thin film resistors which will be appreciated as being an excellent resistor in performance terms but are commonly not available on, e.g., newer, lower-cost CMOS processes.

The application of the network circuitry of the present invention is specifically suited for implementation in DAC environments but it will be appreciated that the approach of the present invention may have equivalent application in other impedance networks or resistor/impedance string structures. Desirably, only contact structures are provided at the beginning and end of the string or snake structure. By implementing a resistor element structure that is almost totally made from a single, base layer of an IC, e.g. a polysilicon layer, the temperature and voltage coefficients of the structure are minimized. The contact structures are normally complex, now often using multiple dopant types, embodied at minimum or near minimum size and also prone to various mechanisms which are not related to the manufacturability or performance of the base layer concerned.

Figure 5A:
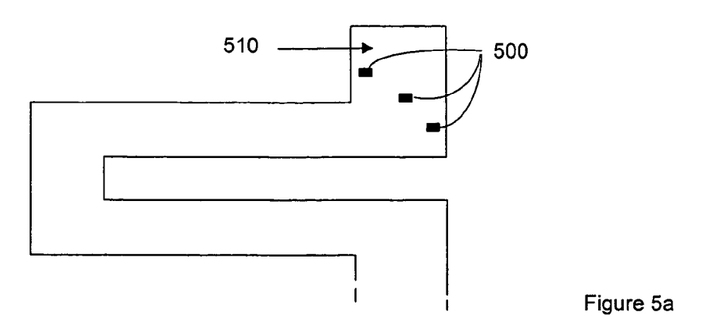
FIGS. 5A to 5D are examples of end contact layouts that may be used with configurations of the present invention
Figure 5B:
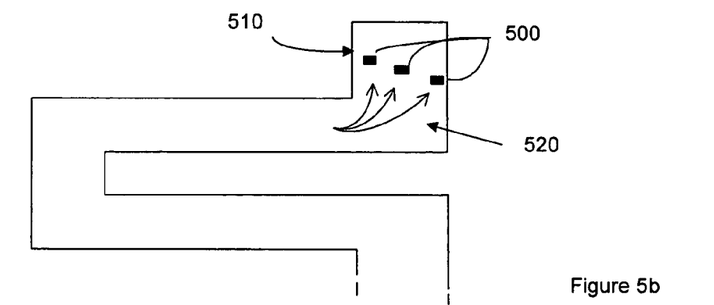
Figure 5C:
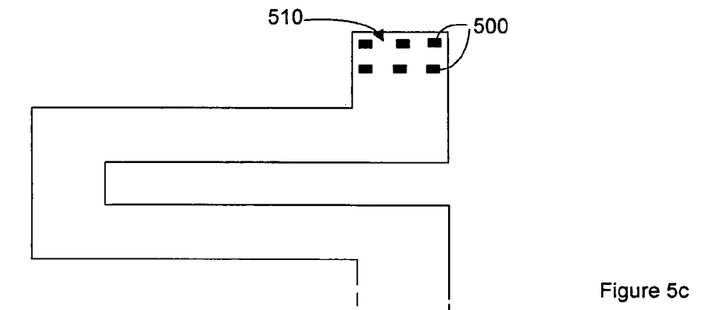
Figure 5D:
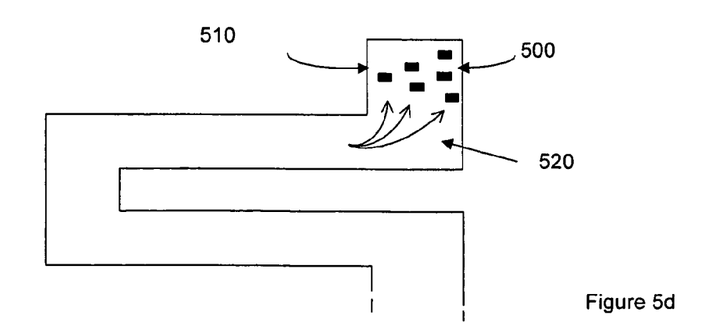

FIGS. 5a–5d show examples of the type of end contact configuration that may be utilized with the network of the present invention. It will be appreciated by those skilled in the art that the actual number and location of these contacts may be optimized using finite element analysis or some other equivalent technique. In FIG. 5a, three end contacts 500 are provided within an end portion 510 of the snake-like network. In FIG. 5b, again three contacts or contact structures 500 are provided, but in this embodiment they are positioned further within the end portion, so as to substantially equalize the current, which is shown schematically as the arrows 520, into each contact. Using the same traffic analogy highlighted above, it will be appreciated that the distance from corner to contact may be equalized so that the current has substantially the same distance to travel to each contact structure, and will therefore favour no single contact structure over another. In FIG. 5c, multiple rows are utilised, and in FIG. 5d multiple rows in a diagonal configuration are provided It will be appreciated that the numbers of contacts and the configuration for arranging same herein described are exemplary of the type of arrangement that may be utilized and it is not intended to limit the present invention to any one specific type or configuration. It will be further appreciated that the techniques of finite element analysis can be used to optimize the body resistor versus termination resistor nominal value(s) and sensitivity to wafer fab processing effects such as misalignment, contact process variances and base layer process variation.

It will be appreciated that the contact impedance element of a termination resistor can be minimized by using multiple structures and minimizing the effects, as shown in FIG. 5b. Similarly, minimizing the contribution of external series impedance is also important. It will be further appreciated by those skilled in the art that the layout embodiment of the termination resistors' surroundings should be substantially very similar to those surrounding the corresponding, matched network resistors so as to minimize the effect of process gradient effects.

It will be appreciated that the contact impedance contribution in the configurations of the present invention is far lower than the normal contact impedance as per FIGS. 1A–1D, and typically an order of magnitude less.

Figure 6:
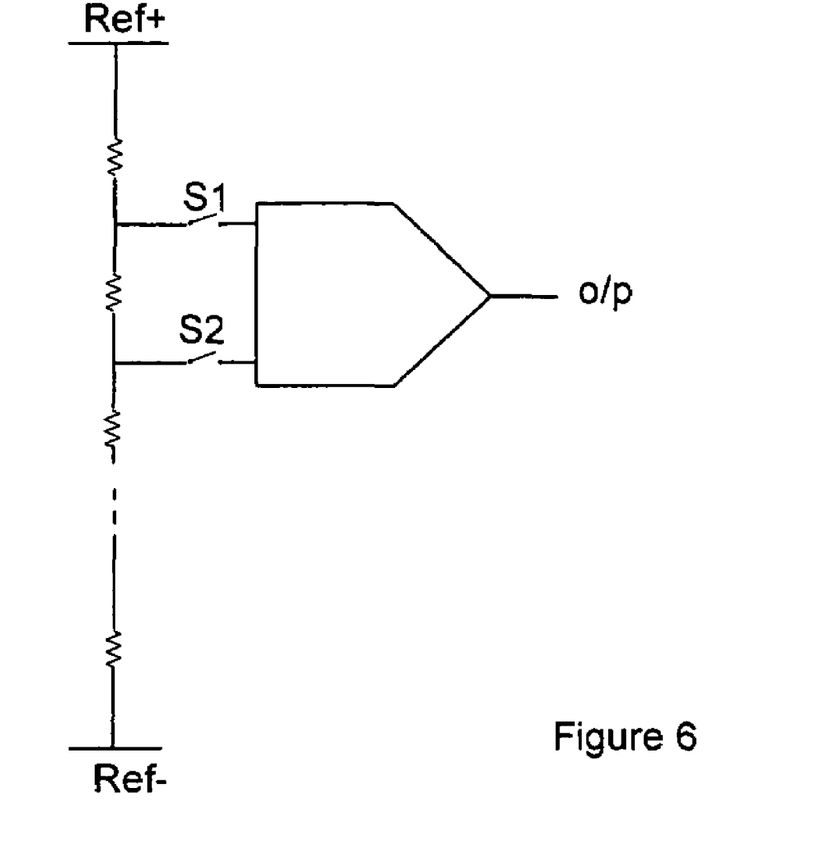
FIG. 6 is a schematic of a string primary DAC.

FIG. 6 shows in schematic form an application of the network configuration of the present invention to a cascaded resistive DAC arrangement. In this arrangement there are four points where there is a crossing or changing of resistive properties from the base layer to the interconnect layer, but it will be appreciated that the number of points described is specific to the example described and more or fewer points may be required depending on the specific application of the resistor string. In the embodiment of FIG. 6, the four points are +Ref, –Ref, and at the taps for S1 and S2. It will be appreciated that only four terminations are required to be part of the circuit and that these terminations has associated contact impedances. Utilising the configuration layout of the present invention it is possible to provide these four contacts in a manner which minimizes the contact impedance effect by providing the contacts in the tab portions, and thereby maximizing the use of the base resistor layer. It will be appreciated that the configuration of FIG. 6 is exemplary of the type of string architecture that can be realised using the technique of the present invention. Further examples of the type of configurations would include those described in U.S. Pat. No. 5,969,657 commonly assigned to the present assignee the contents of which are incorporated herein by reference.

It will be appreciated that what has been described herein is a snake-like resistor network which is advantageous over the prior art. Although the network has been described with reference to specific combinations of features, it is not intended to limit the present invention to any one described embodiment of combination of integers except as may be required in the light of the appended claims. It will be apparent to the person skilled in the art that modifications may be made without departing from the spirit and scope of the invention The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A snake-like resistor network configuration having a first resistive element formed from a resistive material provided in a first layer of an integrated circuit, the first resistive element having a first end and a second end; the region between the first and second ends defining a normal conducting path along the configuration through which current will normally travel, the configuration being provided by a plurality of parallel rows, each row having a start portion and an end portion, the end portion of a first row being linkable to the start portion of a second row by means of a linking portion of same resistive material as that of the rows; a second resistive element, the second resistive element being linked to the first resistive element, thereby providing a compound resistor structure; the configuration further providing at least one node between the first and second ends, the at least one node being formed in a tab provided adjacent to the linking portion, the tab being formed of the resistive material, in the first layer, and extending outwardly and substantially perpendicularly from the normal conducting path and the node being remote from the normal conducting path; and a contact structure provided between said resistive elements and contacting the tab, the contact structure enabling programming of the configuration.

2. The network configuration as claimed in claim 1 wherein the tab is provided substantially midway along the linking portion.

3. The network configuration as claimed in claim 2 wherein the linking portion is configured as to be orientated on the integrated circuit in a position substantially perpendicular to the orientation of the parallel rows, thereby providing for the orientation of the tabs to be substantially parallel to the rows.

4. The network configuration as claimed in claim 1 wherein the first and second ends are provided with at least one contact layer, the contact layer providing for the application of an applied signal to the network.

5. The network configuration as claimed in claim 1 wherein the compound resistor structure is a symmetrical structure.

6. The network configuration as claimed in claim 1 wherein the compound resistor structure is an asymmetrical structure.

7. The network configuration as claimed in claim 1 wherein a tab portion of a first element extends so as to join a tab portion of a second element.

8. The network configuration as claimed in claim 1 wherein the resistive material is formed in a continuous manner in the layer of the integrated circuit.

9. A compound network configuration comprising:

a plurality of network configurations, each network configuration having a resistive element formed from a resistive material provided in a first layer of an integrated circuit, the resistive element having a first end and a second end, the region between the first and second ends defining a normal conducting path along the configuration through which current will normally travel, the configuration being provided by a plurality of parallel rows, each row having a start portion and an end portion, the end portion of a first row being linkable to the start portion of a second row by means of a linking portion of same resistive material as that of the rows, and wherein the configuration further provides at least one node between the first and second ends, the at least one node being formed in a tab provided adjacent to the linking portion, the tab being formed of the resistive material, in the first layer, and extending outwardly and substantially perpendicularly from the normal conducting path and the node being remote from the normal conducting path;

a first network configuration being cross-connected to a second network configuration;

the cross connection between the two network configurations defining a second normal conducting path through which current may travel; and a contact structure on at least selected tabs, enabling a programming of the configuration.

10. In an integrated circuit, a voltage dividing circuit, the dividing circuit comprising a path of resistive material having at least two parallel rows linked to one another by a linking portion which is substantially perpendicular to the parallel rows, the linking portion being further provided with a tab of said resistive material extending outwardly from the linking portion and substantially perpendicular thereto, remote from a normal conducting path through the rows of resistive material, the tab being arranged for providing a voltage for the voltage dividing circuit at a node remote from the parallel rows and linking portion and a contact structure on said tab, enabling a programming of the voltage dividing circuit.

11. The circuit of claim 10 further comprising a second pair of parallel rows, each pair provided with a linking portion and tab extending therefrom, the combination of the two pairs providing a symmetrical resistor.

12. The circuit of claim 10, formed in a layer of the integrated circuit.

* * * * *